(12) United States Patent
Morishita

(10) Patent No.: US 6,246,280 B1
(45) Date of Patent: *Jun. 12, 2001

(54) NEGATIVE VOLTAGE GENERATING CIRCUIT WITH HIGH CONTROL RESPONSIVENESS WHICH CAN BE FORMED USING TRANSISTOR WITH LOW BREAKDOWN VOLTAGE AND SEMICONDUCTOR MEMORY DEVICE INCLUDING THE SAME

(75) Inventor: Fukashi Morishita, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/321,884

(22) Filed: May 28, 1999

(30) Foreign Application Priority Data

Nov. 27, 1998 (JP) .................................................. 10-337677

(51) Int. Cl.⁷ .............................. G05F 1/10; G11C 7/00
(52) U.S. Cl. ..................................... 327/535; 365/226
(58) Field of Search ............................. 327/535, 536, 327/537, 538; 365/226

(56) References Cited

U.S. PATENT DOCUMENTS 5,563,548 * 10/1996 Kim et al. ........................... 327/537
5,614,815 * 3/1997 Yamagata et al. .................. 327/538
5,760,638 * 6/1998 Brigati et al. ...................... 327/536

OTHER PUBLICATIONS

"Low Voltage Circuit Design Techniques for Battery–Operated and/or Giga–Scale DRAM's", by T. Yamagata et al., IEEE Journal of Solid–State Circuits, vol. 30, No. 11, Nov. 1995, pp. 1183–1188.

"As Precise On–Chip Voltage Generator for a Giga–Scale DRAM with a Negative Word–Line Scheme", by H. Tanaka et al., 1998 Symposium on VLSI Circuits Digest of Technical Papers, pp. 94095.

Ultra LSI Memory, by Kioo Ito, pp1 241–242 (with Partial Translation

* cited by examiner

Primary Examiner—Trong Phan
(74) Attorney, Agent, or Firm—McDermott, Will & Emery

(57) ABSTRACT

A voltage generating circuit of the present invention includes a charge pump regulator and a voltage converting circuit. Charge pump regulator receives Ext.Vcc and a ground voltage as inputs and outputs a negative voltage Vbb1. Charge pump regulator receives Int.Vcc and negative voltage Vbb1 as inputs and outputs negative voltage Vbb2 (<Vbb1). Voltage converting circuit receives Int.Vcc and negative voltage Vbb2 as inputs and outputs an output voltage Vnn. In each of charge pump regulator, a voltage difference between the input and the output is designed such that it is equal to or lower than a prescribed value determined by a size of a transistor.

21 Claims, 5 Drawing Sheets

NEGATIVE VOLTAGE GENERATING CIRCUIT WITH HIGH CONTROL RESPONSIVENESS WHICH CAN BE FORMED USING TRANSISTOR WITH LOW BREAKDOWN VOLTAGE AND SEMICONDUCTOR MEMORY DEVICE INCLUDING THE SAME

BACKGROUND OF THE INVENTION

1. Field of the Invention

The present invention relates to a structure of a voltage generating circuit responsive to a reference voltage for outputting a negative voltage and, particularly to a structure of a voltage generating circuit with high control responsiveness for a voltage while ensuring an operation reliability of a transistor in the voltage generating circuit. The present invention also relates to a semiconductor memory device using the voltage generating circuit for driving a word line.

2. Description of the Background Art

Recently, an instrument driven by a battery such as a portable personal computer or information terminal instrument is widely used. Thus, reduction in power consumption of a semiconductor memory, that is, at a low voltage operation, is required.

A size of a transistor is on the decrease due to development in fine patterning of the transistor with increase in a capacity of a semiconductor memory. In this respect, the low voltage operation is an indispensable requirement to ensure a reliability of the operation of the transistor.

In this context, a relation between an operating voltage (Vcc) and a threshold voltage (Vt) of the transistor is becoming important. Generally, an operation speed of a transistor is in inverse proportion to a difference between a power supply voltage and a threshold voltage, that is, Vcc−Vt. Thus, threshold voltage Vt must be decreased to ensure a sufficient speed with the low voltage operation.

However, as threshold voltage Vt decreases, a subthreshold current in a cut-off region increases. In a dynamic random access memory (which is hereinafter abbreviated as DRAM) which is used as a general-purpose product, data holding time is preliminary defined as a specification. The aforementioned problem has a significant impact on a transistor especially used for a memory cell of a DRAM. More specifically, increase in a leakage current results in reduction in the data holding time, and therefore it is extremely difficult to allow threshold voltage (Vt) to be freely decreased with decrease in operating voltage (Vcc).

For sufficiently writing data at an "H" level to a memory cell, a maximum word line voltage corresponding to a selection state ("H" level) of the word line which is connected to a gate of an access transistor of the memory cell must be set at Vcc+Vt or higher. Thus, threshold voltage (Vt) must be set at a low value in order to ensure a reliability of the gate oxide film of a fine patterned transistor.

As described above, setting of threshold voltage (Vt) of the transistor is extremely difficult with such requirement for the low voltage operation of the semiconductor memory.

To solve this problem, a structure of a word line which is driven by a negative voltage has been proposed as shown in "Low Voltage Circuit Design Techniques for Battery-Operated and/or Giga-Scale DRAM's", by T. Yamagata et al., *IEEE Journal of Solid-State Circuits*, 1995, pp. 1183–1188 (which is hereinafter called as a first conventional art).

In the first conventional art, a maximum word line voltage (that is a voltage applied to a gate of a transistor of a memory cell) required for writing data at the "H" level is decreased by decreasing a threshold voltage of the transistor of the memory cell, so that reliability of the transistor is ensured. At the same time, a negative voltage is applied to the word line when holding data to prevent leakage of a subthreshold voltage, so that a sufficient data holding time is ensured.

To implement the structure, stability of the negative voltage applied to the word line when holding data is very important. The subthreshold current causing leakage increases by about ten times if a gate voltage increases by 0.1V. Thus, a voltage generating circuit capable of supplying a negative voltage with high accuracy is required for driving the word line.

A structure has been proposed as a negative voltage generating circuit with accuracy which can be used for this purpose in "A Precise On-Chip Voltage Generator for a Giga-Scale DRAM with a Negative Word-Line Scheme", by H. Tanaka et al., 1998 *Symposium on VLSI Circuits Digest of Technical Papers*, pp. 94–95 (which is hereinafter called as a second conventional art).

FIG. 9 is a schematic block diagram showing an overall structure of a voltage generating circuit 500 of the second conventional art.

Referring to FIG. 9, voltage generating circuit 500 includes: a charge pump regulator 530 outputting a negative voltage Vbb to a line 532; a differential amplifier 510 comparing a reference voltage Vrn and an output voltage Vnn and amplifying a difference therebetween for output; and an N channel transistor 520 responsive to an output from differential amplifier 510 for controlling an amount of electric charges supplied for a line 533 transmitting output voltage Vnn from the line 532.

Voltage generating circuit 500 is applied to a semiconductor memory device, and generates output voltage Vnn(−0.75V) used for driving a word line when holding data and Vbb(−1.0V) used as a voltage for back bias of a semiconductor substrate.

An exemplary circuit structure of charge pump regulator 530 is shown, for example, in *Ultra LSI Memory* (by Kiyoo Ito, Baifukan) pp. 241–242. FIG. 10 is a circuit diagram showing an exemplary structure of charge pump regulator 530.

Referring to FIG. 10, charge pump regulator 530 includes a self-oscillator 540 and a charge pump circuit 550. Self-oscillator 540 generates a pulse signal at a frequency f1 with two states of "H" level (Vcc) and "L" level (GND).

Charge pump circuit 550 includes: an output node Ne; an intermediate node Nb; a charge capacitor C1 receiving an output from self-oscillator 540 and connected to intermediate node Nd; a transistor Q1 for rectification connected between intermediate node Nd and a ground line; and a transistor Q2 for rectification connected between intermediate node Nd and output node Ne. There is a parasitic capacitance C2 (C1>>C2) between intermediate node Nd and the ground line.

Voltage Vbb generated at output node Ne is applied to a substrate (a substrate capacitance $C_{SUB}$) as a back bias voltage. Consumed substrate current is indicated by a current source (Ibb) connected in parallel to substrate capacitance $C_{SUB}$.

In charge pump circuit 550, a voltage in pulse (with amplitude of Vcc) is periodically applied to the capacitance of charge capacitor C1, and transistor Q1 or transistor Q2 is turned on in accordance with a potential at intermediate node Nd. Thus, electrons stored in charge capacitor C1 are supplied for a load (substrate capacitance $C_{SUB}$) until output voltage Vbb at node Ne reaches a maximum negative voltage Vnmin=−Vcc+Vt1+Vt2(Vt1: threshold voltage of transistor Q1, Vt2: threshold voltage of transistor Q2).

Conversely, when back bias voltage Vbb is externally applied, a current supplying ability of charge pump regulator 530 is represented by a product of ΔV(ΔV=Vbb−Vnmin), which is a difference between the above mentioned maximum negative voltage Vnmin and output voltage Vbb, a capacitance value of the charge capacitor and frequency f of the self-oscillator (C1·ΔV·f).

Body regions of transistors Q1 and Q2 included in charge pump circuit 550 are connected to output node Ne, and transistors Q1 and Q2 are also back biased by output voltage Vbb. Thus, a voltage at Vcc−Vbb at maximum is applied to a gate oxide film of transistor Q1.

Voltage generating circuit 500 maintains output voltage Vnn at reference voltage Vrn by driving differential amplifier 510 by voltage Vbb at an output node of charge pump regulator 530 and a power supply voltage Vcc, controlling an amount of current through a current path formed in transistor 520 in accordance with an output from differential amplifier 510 and supplying electric charges necessary for the line 533. Voltage generating circuit 500 is characterized in that, even when voltage Vbb changes, the affect of the change is not readily transmitted to output voltage Vnn.

In voltage generating circuit 500, however, supply of electric charges for controlling output voltage Vnn is performed through a transistor 520, so that an ability of supplying electric charges of the transistor is extremely low when a source-drain voltage Vds applied to transistor 520 is small. In the second conventional art, Vds is as low as 0.25V as output voltage Vnn=−0.75V and substrate voltage Vbb=−1.0V, and therefore it is difficult to ensure sufficient responsiveness of output voltage Vnn.

When the source-drain voltage of transistor 520 is to be ensured by decreasing output voltage Vbb of charge pump regulator 530 in order to increase responsiveness of output voltage Vnn, a maximum value of the voltage applied to the gate oxide film of transistor Q1 shown in FIG. 10 increases. Thus, reliability of the transistor is reduced because of the relation with the size of the transistor forming the charge pump circuit.

The ability of supplying electric charges of charge pump circuit 550 is determined depending on the relation between maximum negative voltage Vnmax and output voltage Vbb or the like, as described above. When current consumption for the word line exceeds the supplying ability of charge pump circuit 550, both of voltages Vnn and Vbb would ultimately change in a positive direction.

FIG. 11 is a schematic diagram shown in conjunction with changes in voltages Vnn and Vbb with an operation of the word line.

Referring to FIG. 11, when a large amount of current is consumed by an operation of the word line, a significant amount of electric charges is supplied form the line 532 supplying Vbb. In this case, for the second conventional art, charge pump regulator 530 which inherently performs power supply for back bias of the substrate further supplies current necessary for driving the word line during data holding time. As a result, the voltage may disadvantageously be changed in the positive direction.

SUMMARY OF THE INVENTION

An object of the present invention is to provide a voltage generating circuit including a transistor with a thin gate oxide film designed for an operation at a low voltage and capable of generating a negative voltage having a sufficient control responsiveness while ensuring an operation reliability of the transistor.

Another object of the present invention is to provide a structure of a semiconductor memory device with improved data holding characteristic by using a negative voltage with high control responsiveness output from the above mentioned voltage generating circuit for driving the word line when holding data.

In short, the present invention is a voltage generating circuit generating a negative output voltage in accordance with a reference voltage and includes an sub-voltage generating circuit and a voltage converting circuit.

The voltage converting circuit is driven by a first voltage higher than the output voltage and a second negative voltage lower than the output voltage for generating an output voltage which follows the reference voltage.

The sub-voltage generating circuit supplies the second negative voltage and includes first to m-th sub-voltage converting circuits each driven by a corresponding first driving voltage which is equal to or lower than a ground voltage and equal to or higher than the second negative voltage and by a corresponding second driving voltage for generating a corresponding internal negative voltage.

The first sub-voltage converting circuit receives the ground voltage as the corresponding first driving voltage and a third positive voltage as the corresponding second driving voltage for generating and controlling a first internal negative voltage so as to maintain a difference between the first internal negative voltage and the third positive voltage within a prescribed value.

The i-th sub-voltage converting circuit ($2 \leq i \leq m$) receives the (i−1)th internal negative voltage generated by the (i−1)th sub-voltage converting circuit as the corresponding first driving voltage and the (i+2)th positive voltage as the corresponding second driving voltage for generating and controlling an i-th internal negative voltage so as to maintain a difference between the i-th internal negative voltage and said (i+2)th positive voltage within the prescribed value.

The m-th sub-voltage converting circuit generates a second negative voltage as the m-th internal negative voltage.

According to another aspect of the present invention, a semiconductor memory device for inputting or outputting a storage data in accordance with an address signal is provided with a memory cell array, a word line, a row selecting means and a voltage generating circuit.

The memory cell array has a plurality of memory cells arranged in a matrix. The word line is arranged for every row of the memory cell. The row selecting means selectively activates the word line in accordance with the address signal. The voltage generating circuit includes: a voltage converting circuit driven by a first voltage higher than the an output voltage and a second negative voltage lower than the output voltage for generating an output voltage which follows a reference voltage; and an sub-voltage generating circuit generating the second negative voltage.

The sub-voltage generating circuit includes first to m-th sub-voltage converting circuits each driven by a corresponding first driving voltage which is equal to or lower than a ground voltage and equal to or higher than the second negative voltage and by a corresponding second driving voltage for generating a corresponding internal negative voltage.

The sub-voltage converting circuit receives a ground voltage as the corresponding first driving voltage and a third positive voltage as the corresponding second driving voltage for generating and controlling a first internal negative voltage so as to maintain a difference between the first internal negative voltage and the third positive voltage within a prescribed value.

The i-th sub-voltage converting circuit (2≦i≦m) receives the (i−1)th internal negative voltage generated by the (i−1)th sub-voltage converting circuit as the corresponding first driving voltage and the (i+2)th positive voltage as the corresponding second driving voltage for generating and controlling an i-th internal negative voltage so as to maintain a difference between the i-th internal negative voltage and said (i+2)th positive voltage within the prescribed value.

The m-th sub-voltage converting circuit generates a second negative voltage as the m-th internal negative voltage.

Therefore, a main advantage of the present invention is that a control responsiveness of the output voltage in the voltage converting circuit is enhanced while ensuring reliability of the transistor forming the sub-voltage converting circuit as the difference between the input voltage and the negative voltage to be output in the sub-voltage converting circuit is set at a value which is equal to or lower than the prescribed value and a negative voltage which is lower in steps is generated for obtaining the output voltage.

In addition, as the word line is driven when holding data of the memory cell by the voltage generating circuit capable of supplying a stable negative voltage, leakage current of the memory cell transistor is reduced and data holding characteristic is improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
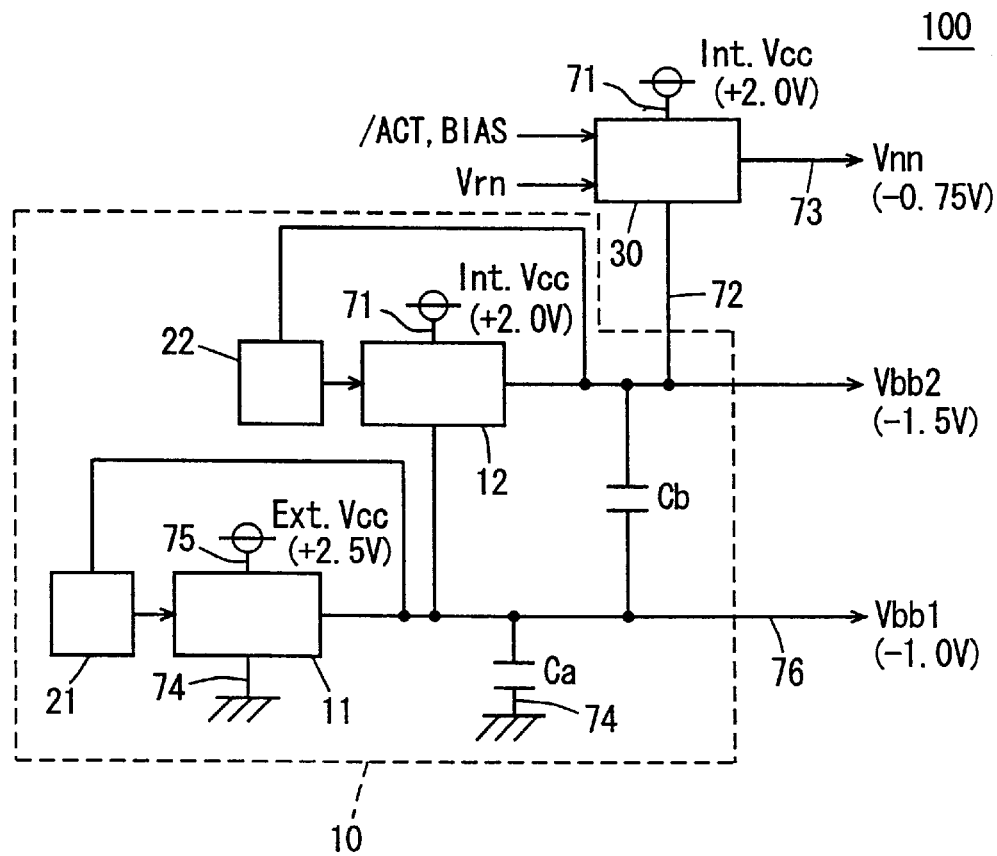
FIG. 1 is a schematic block diagram showing an overall structure of a voltage generating circuit 100 according to a first embodiment of the present invention.

Embodiments of the present invention will now be described in detail with reference to the drawings. It is noted that the same reference numerals in the drawings indicate the same or corresponding portions.

First Embodiment

Referring to FIG. 1, a voltage generating circuit 100 is provided with a Vbb generating circuit 10. Vbb generating circuit 10 includes: a charge pump regulator 11 supplied with a power supply voltage by a line 75 supplying Ext.Vcc (+2.5V) and a line 74 supplying a ground voltage for outputting a negative voltage Vbb1(−1.0V); and a charge pump regulator 12 supplied with a power supply voltage by a line 71 supplying Int.Vcc(+2.0V) and a line 76 supplying a negative voltage Vbb1 for outputting a negative voltage Vbb2(−1.5V). Voltage generating circuit 100 further includes a voltage converting circuit 30 supplied with a power supply voltage from the line 71 and a line 72 supplying negative voltage Vbb2 for outputting a negative voltage Vnn(−0.75V).

It is noted that although specific numerical values are given for each of power supply voltages and output voltages for comparison with the conventional art, the voltages are not limited to these exemplary values in the present application.

Vbb circuit 10 further includes capacitors Ca and Cb for stabilizing negative voltages Vbb1 and Vbb2.

Voltage generating circuit 100 is characterized in that voltage converting circuit 30 generating output voltage Vnn is driven by Vbb2 which is a negative voltage still lower than Vbb1, and in that a charge pump regulator 12 is independently provided for generating negative voltage Vbb2, as compared with a conventional voltage generating circuit 500.

Control responsiveness of output voltage Vnn is enhanced as voltage converting circuit 30 is driven by negative voltage Vbb2 still lower than negative voltage Vbb1, which will later be described in detail.

A level detecting circuit 21 is provided corresponding to charge pump regulator 11 for detecting a voltage of the line 76. Level detecting circuit 21 detects a voltage of the line 76 and drives charge pump regulator 11 when voltage of the line 76 increases from a constant reference value. Charge pump regulator 11 operates in accordance with an instruction of level detecting circuit 11 and maintains the voltage of the line 76 at Vbb1 by supplying electric charges for the line 76.

Figure 10:
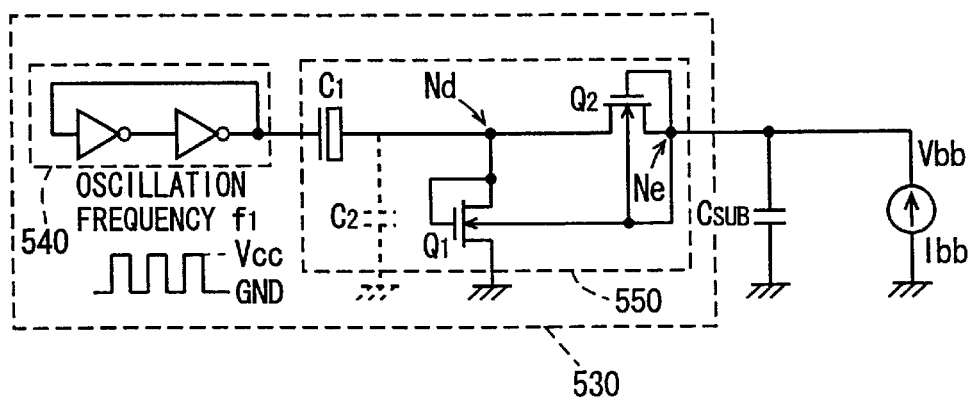
FIG. 10 is a circuit diagram showing a structure of a charge pump regulator 530.
Figure 11:
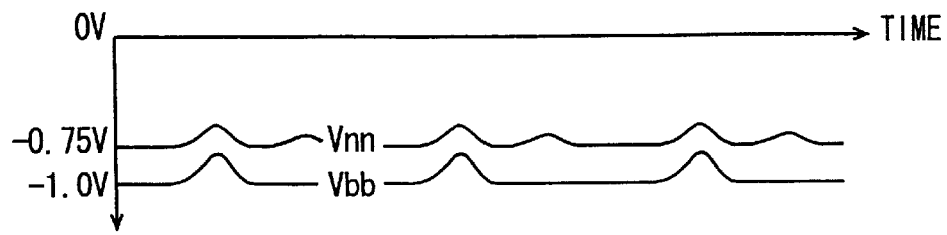
FIG. 11 is a diagram shown in conjunction with a relation between output values in voltage generating circuit 500 of the conventional art.

A specific circuit structure of charge pump regulator 11 is similar to that of charge pump regulator 530 shown in FIG. 10, and therefore description thereof will not be repeated.

In charge pump regulator 11, a difference between the power supply voltage and the output voltage, that is, a difference between Ext.Vcc(+2.5V) and Vbb1(−1.0V), is set below a prescribed value (3.5V in the present embodiment).

The prescribed value is determined such that an operation reliability of the transistor is ensured in accordance with a size of a transistor (transistor Q1 shown in FIG. 10) included in charge pump regulator 11, that is, a thickness of a gate oxide film.

Similarly, a level detecting circuit 22 is provided for charge pump regulator 12. A difference between the power supply voltage and the output voltage, that is, the difference between Int.Vcc(+2.0V) and Vbb2(−1.5V) is set for the same object and in the same method as in the case of charge pump regulator 11.

Level detecting circuits 21 and 22 generate a trigger signal by a detection transistor which is rendered conductive with decrease in the voltage of the monitored line for driving charge pump regulator 11 or 12. However, the size of the detection transistor may suitably be determined in accordance with a control responsiveness required for the monitored line.

More specifically, for the level detecting circuit monitoring the voltage of the line for which the high control responsiveness is required, a design may be obtained by using a transistor which is large in size (W/L, where L: transistor length, W: transistor width) while attaching importance to a responding speed. Conversely, for the level detecting circuit monitoring a line for which the control responsiveness is not severely required, a transistor in a small size may be used while attaching importance to reduction in power consumption.

Figure 2:
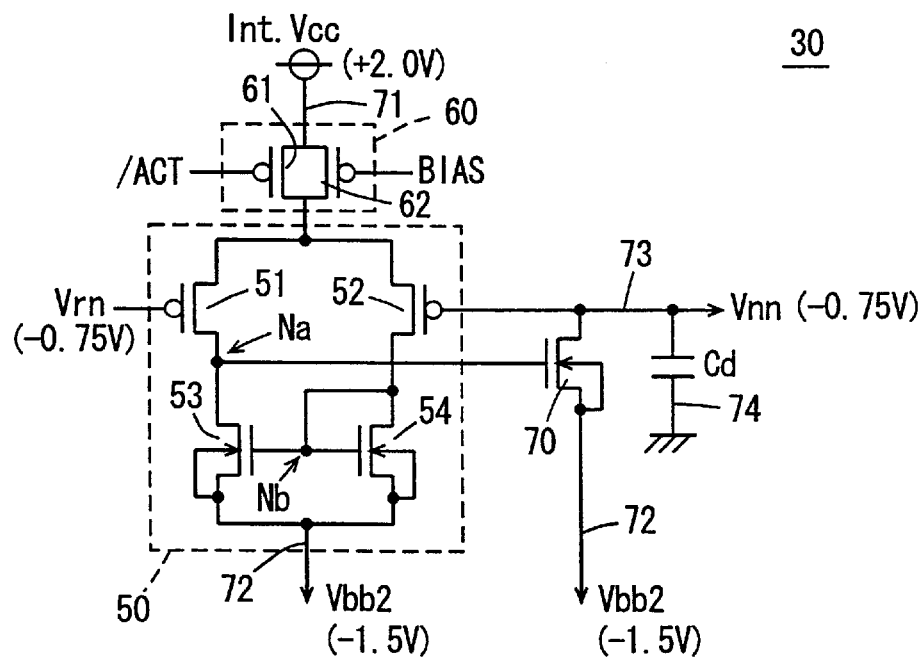
FIG. 2 is a circuit diagram showing a structure of a voltage converting circuit 30.

FIG. 2 is a circuit diagram showing in detail a structure of voltage converting circuit 30 of a voltage generating circuit 100.

Referring to FIG. 2, voltage converting circuit 30 includes: a differential amplifier 50 amplifying and outputting a difference between a reference voltage Vrn(−0.75V) applied from a reference voltage generating circuit (not shown) and an output voltage Vnn; a current control transistor 70 responsive to an output from differential amplifier 50 for controlling an amount of current supplied for the line 73 transmitting output voltage Vnn from the line 72 supplying a negative voltage Vbb2; and a stabilizing capacitor Cd provided for reducing change in the output voltage.

Differential amplifier 50 receives voltages Int.Vcc(+2.0V) and Vbb2(−1.5V) respectively from the lines 71 and 72 for operation. A current adjusting circuit 60 is connected between line 71 and differential amplifier 50 for controlling an amount of current which drives differential amplifier 50 in accordance with externally applied control signals /ACT and BIAS.

Differential amplifier 50 includes: an output node Na; an intermediate node Nb; a P type transistor 51 having its gate receiving a reference voltage Vrn and connected between output node Na and current adjusting circuit 60; a P type transistor 52 having its gate receiving output voltage Vnn and connected between intermediate node Nb and current adjusting circuit 60; an N type transistor 53 having its gate connected to intermediate node Nb and connecting output node Na and the line 72; and an N type transistor 54 having its gate connected to intermediate node Nb and connected between intermediate node Nb and the line 72.

In differential amplifier 50, a source-drain voltage is generated in N type transistor 53 in response to a difference between gate voltages of P type transistors 51 and 52, that is, a difference between reference voltage Vrn and output voltage Vnn, so that a voltage is obtained at output node Na by amplifying the difference therebetween.

Output node Na is connected to a gate of current control transistor 70. When output voltage Vnn is increased with respect to reference voltage Vrn, electric charges in accordance with the gate voltage of current control transistor 70 are supplied from the line 72 for the line 73.

Stabilizing capacitor Cd is provided between the line 73 and a ground line 74 for reducing a ripple component of output voltage Vnn.

Current adjusting circuit 60 has P type transistors 61 and 62 which are connected between the line 71 and differential amplifier 50. The externally applied control signal /ACT is applied to a gate of P type transistor 61, and control signal BIAS is similarly applied to the gate of P type transistor 62. Here, /ACT is a signal which is activated to ensure a sufficient responding speed of the differential amplifier by supplying a sufficient amount of current to differential amplifier 50 when a load supplied with output voltage Vnn consumes a large amount of current (when in an active state). As a sufficient current drivability is required for P type transistor 61, a transistor in a large size or a plurality of small transistors connected in parallel is used therefor.

On the other hand, when a significant amount of current is not necessary for the load (during stand-by), P type transistor 61 is turned off and BIAS at an intermediate voltage which turns on P type transistor 62 in a linear region is applied for supplying a small amount of current for differential amplifier 50.

As described above, the responding speed of differential amplifier 50 is increased by using a lower negative voltage Vbb as a driving power supply for differential amplifier 50, and source-drain voltage Vds of current control transistor 70 is increased. As a result, control responsiveness of output voltage Vnn is increased. Further, current adjusting circuit 60 provides responsiveness in the active state and allows reduction in power consumption of the circuit during stand-by, so that overall reduction in power consumption is achieved.

Figure 3:
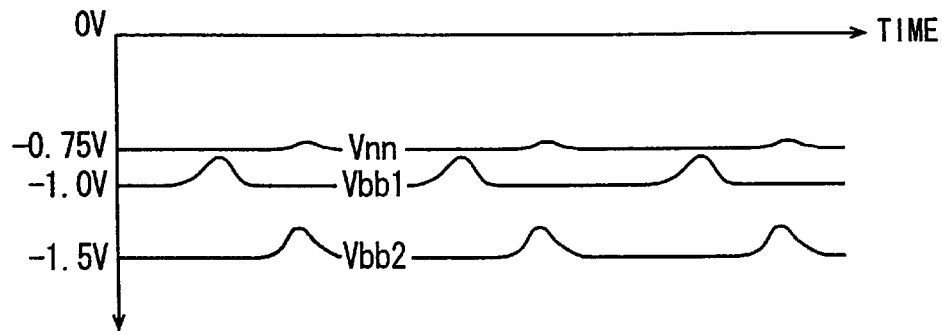
FIG. 3 is a diagram shown in conjunction with a change in an output voltage in voltage generating circuit 100.
Figure 9:
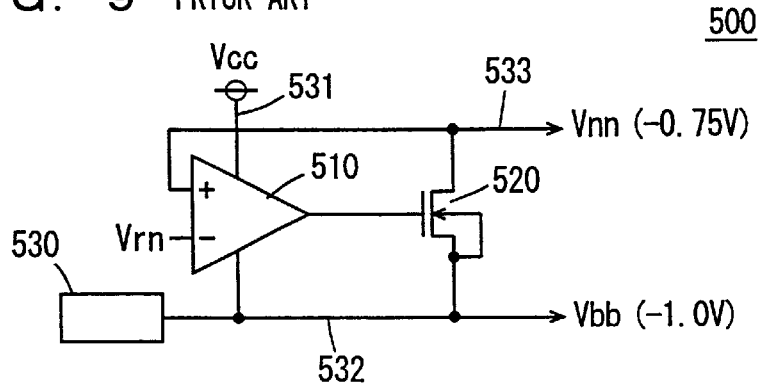
FIG. 9 is a schematic block diagram showing an overall structure of a voltage generating circuit 500 of a conventional art.

Referring to FIG. 3, lower negative voltage Vbb2 generated as a driving power supply of voltage converting circuit 30 is significantly different from output voltage Vnn, so that change in negative voltage Vbb2 would not adversely affect output voltage Vnn. The line for supplying voltage Vbb1 and that for transmitting output voltage Vnn are independently provided, whereby a margin is obtained for a supplying ability of charge pump regulator 11 as compared with the second conventional art, and a change in output voltage Vbb1 would not directly affect stability of output voltage Vnn. Thus, in voltage generating circuit 100, mutual interference between output voltages of the charge pump regulator and the voltage converting circuit is reduced, so that the negative voltage is more stably supplied.

Further, in voltage converting circuit 30, if a maximum difference between the power supply voltage and the output voltage (which is a difference between Int.Vcc(+2.0V) and Vbb2(−1.5V) in the present embodiment) is set below a prescribed value (which is 3.5V in the present embodiment) similar to those for charge pump regulators 11 and 21, sufficient protection for circuit elements can be obtained.

Application of First Embodiment

As an application of the first embodiment of the present invention, a structure of a semiconductor memory device in which a voltage generated by voltage generating circuit 100 of the first embodiment is used for driving a word line will be described.

Figure 4:
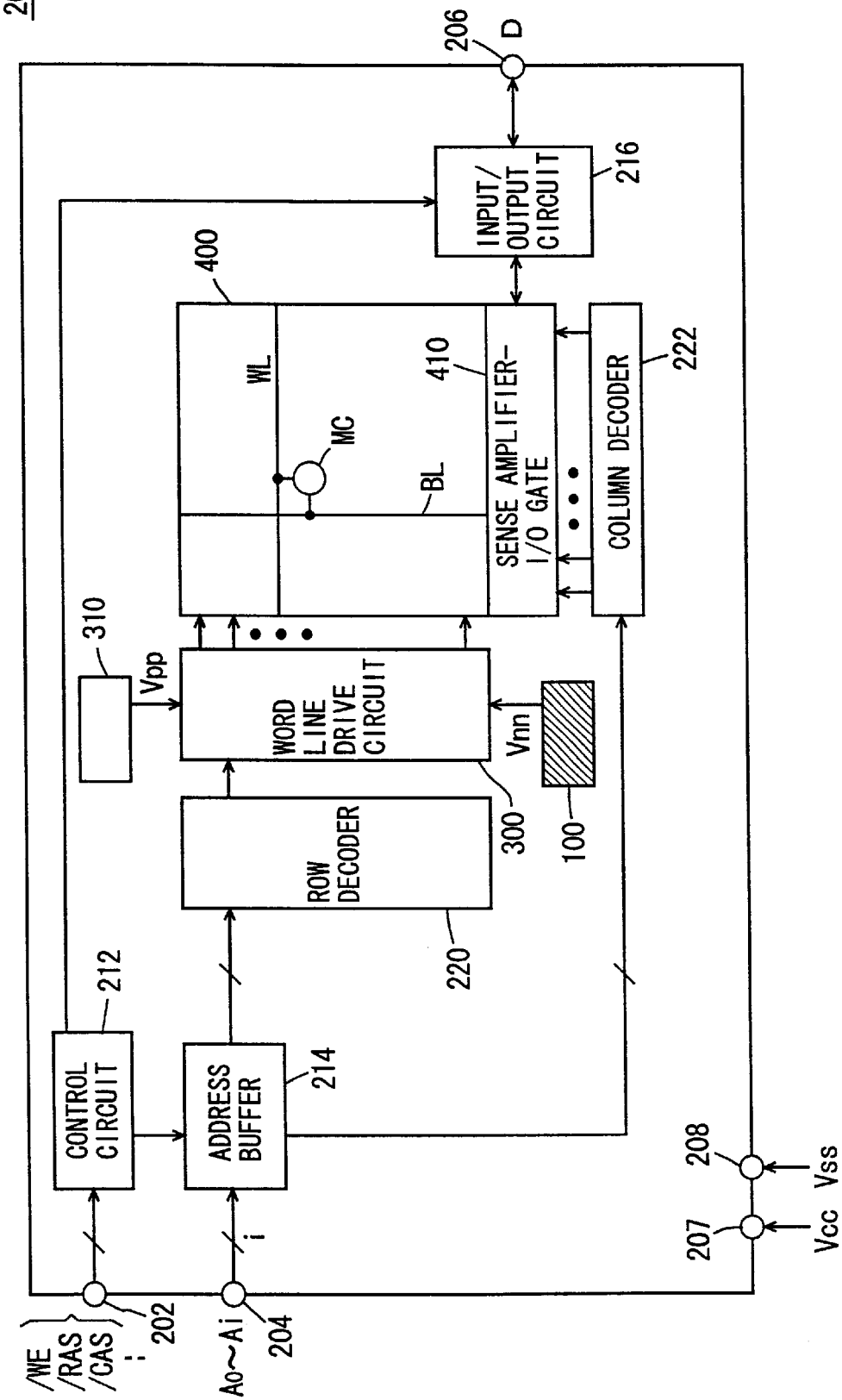
FIG. 4 is a schematic block diagram showing an overall structure of a semiconductor memory device 200 which is an application of the first embodiment of the present invention.

Referring to FIG. 4, a semiconductor memory device 200 includes: a control signal input terminal 202 receiving a control signal such as a row address strobe signal /RAS, a column address strobe signal /CAS and a write enable signal /WE; an address input terminal 204 inputting address signals A0 to Ai (i: natural number); an input/output terminal 206 for inputting/outputting data; a Vcc terminal 207 inputting a power supply voltage Vcc; and a Vss terminal 208 inputting a ground terminal Vss.

Semiconductor memory device 200 further includes: a control circuit 212 controlling an overall operation of the semiconductor memory device in accordance with a control signal; an address buffer 214 receiving an external address signal from address input terminal 204 in accordance with an instruction from control circuit 212 for generating an internal address signal; and a memory cell array 400 having a plurality of memory cells MC arranged in a matrix. Memory cell MC includes a capacitor for holding data, and an access transistor having a gate connected to a word line corresponding to each row.

In memory cell array 400, a word line WL and a bit line BL are arranged for each row and column of the memory cell, respectively. A row and column of the memory cell are selected by a row decoder 220 and a column decoder 222 in accordance with the internal address signal generated by an address buffer. Corresponding word line WL is selectively activated by a word line drive circuit 300 in accordance with an output from row decoder 220.

Word line drive circuit 300 receives voltages Vnn and Vpp respectively from voltage generating circuits 100 and 310 for activating or inactivating the word line. For data reading, voltage Vpp is applied to word line WL, which is thereby brought into an active state. For data holding, voltage Vnn is applied to word line WL, which is brought into an inactive state.

A sense amplifier-I/O gate 410 is controlled in accordance with an output from column decoder 222, and a storage data is input/output between input/output terminal 206 and memory cell MC through input/output circuit 216.

In semiconductor memory device 200, a structure of a negative voltage word line which has been described in the description of the conventional art is used. When corresponding word line WL is in the inactive state during data holding of the memory cell, negative voltage Vnn is applied to the word line.

If negative voltage Vnn is output from voltage generating circuit 100 having a circuit structure described in the first embodiment, a stable negative voltage can be supplied for the word line, whereby data holding characteristic is enhanced by reduction in a subthreshold current of the memory cell transistor.

When negative voltage Vbb1 generated in voltage generating circuit 100 is used as a substrate bias voltage of the transistor in whole semiconductor memory device 200, changes in output voltage Vnn and substrate bias voltage Vbb1 due to driving of the word line cannot readily affect each other. Thus, the semiconductor memory device can be supplied a stable negative voltage as a whole.

Second Embodiment

A variation of voltage converting circuit 30 generating output voltage Vnn of voltage generating circuit 100 will now be described.

Figure 5:
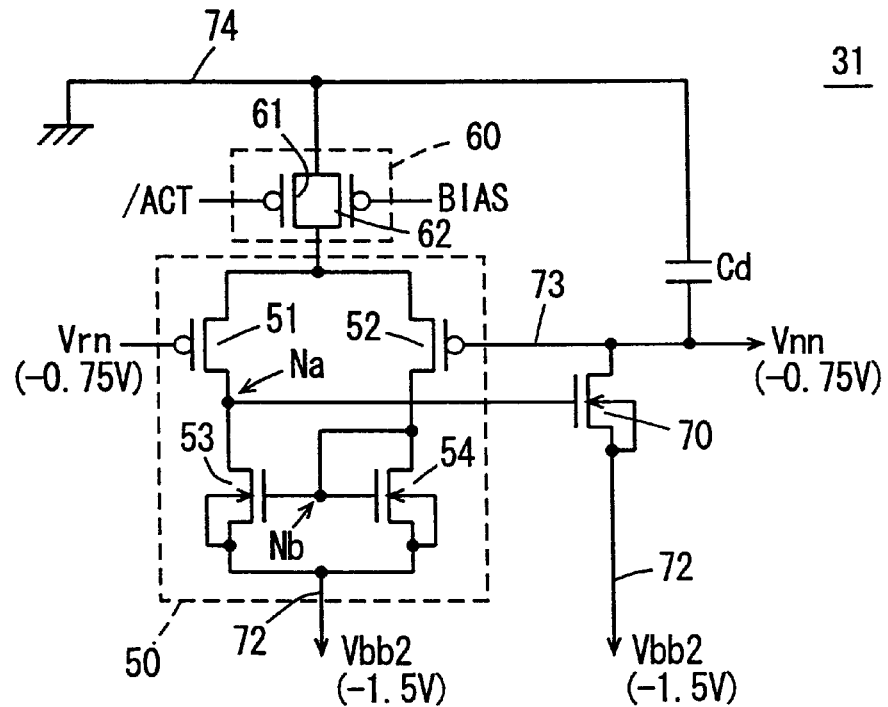
FIG. 5 a circuit diagram showing a structure of a voltage converting circuit 31 of a voltage generating circuit according to a second embodiment of the present invention.

FIG. 5 is a circuit diagram showing an overall structure of a voltage converting circuit 31 of a negative voltage generating circuit according to a second embodiment of the present invention.

Referring to FIG. 5, voltage converting circuit 31 according to the second embodiment is different from voltage converting circuit 30 of the first embodiment in that one of power supply voltages (which is on the side of higher voltage) for driving differential amplifier 50 is changed form Int.Vcc to a ground voltage. Other parts of the circuit structure and operation thereof are similar to those of voltage converting circuit 30, and therefore description thereof will not be repeated.

In order to operate differential amplifier 50 for amplifying changes in output voltage Vnn and reference voltage Vrn with a high gain, in P type transistors 51 and 52 having their gates respectively receiving output voltage Vnn and reference voltage Vrn, P type transistors 51 and 52 must be operated in a saturation region, so that a ratio of a change in a source-drain current Ids to a change in a gate-source voltage Vgs is increased. To that end, a relation of Vds>Vgs−Vt(Vt:threshold voltage) must be obtained for P type transistors 51 and 52. On the other hand, as the current flowing through the transistor is dependent on Vgs, when a negative voltage (on the side of the lower voltage) driving differential amplifier 50 is a negative voltage which is still lower or when a threshold voltage Vt of P type transistors 51 and 52 is small, even if one of the power supplies which drives differential amplifier 50 (on the side of the higher voltage) is a ground voltage, P type transistors 51 and 52 can be operated in the saturation region. At the same time, power consumption of the transistor is reduced.

As described above, the structure of voltage converting circuit 31 allows further reduction in power consumption, in accordance with the value of the driving voltage of differential amplifier 50 or the threshold voltage of P type transistors 51 and 52.

Third Embodiment

Figure 6:
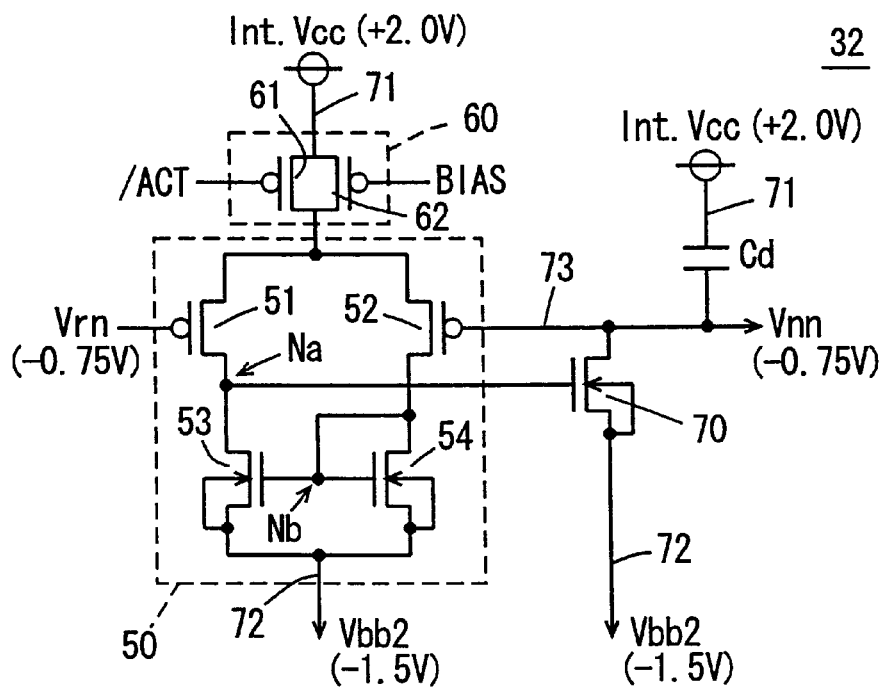
FIG. 6 is a circuit diagram showing a structure of a voltage converting circuit 32 of a voltage generating circuit according to a third embodiment of the present invention.

Referring to FIG. 6, a voltage converting circuit 32 is different from voltage converting circuit 30 of the first embodiment in that a stabilizing capacitor Cd is provided between a line 73 transmitting output voltage Vnn and a line 71 supplying a power supply voltage Int.Vcc.

Other parts of the structure are similar to those of voltage converting circuit 30 of the first embodiment, and therefore description thereof will not be repeated.

Comparing the ground voltage and power supply voltage Int.Vcc, generally, a change in the ground voltage is smaller. Then, in the first embodiment, stabilizing capacitor Cd is connected between line 73 and ground line 74.

When output voltage Vnn is used for driving a word line during data holding in the semiconductor memory device, however, a change in output voltage Vnn in a positive direction must severely be prevented.

Considering a characteristic of the power supply voltage in these respects, the ground voltage is readily changed in the positive direction as it is on the side to which the current flows. On the other hand, power supply voltage Int.Vcc is on the side from which the current is supplied, so that a voltage change in the positive direction does not readily occur though the voltage change in a negative direction readily occurs.

When there is a margin for a layout or the like of a VDC (Voltage Down Converter) generating power supply voltage Int.Vcc to allow an increase in the size of the transistor forming the VDC or in a capacity of a capacitor for stabilizing an output is possible and sufficient stability is ensured for power supply voltage Int.Vcc, connection of stabilizing capacitor Cd between lines 73 and 71 allows further reduction in the change of output voltage Vnn in the positive direction.

Having the above mentioned structure, voltage converting circuit 32 according to the third embodiment can supply a negative output voltage which has a lower risk of being changed in the positive direction.

Fourth Embodiment

Figure 7:
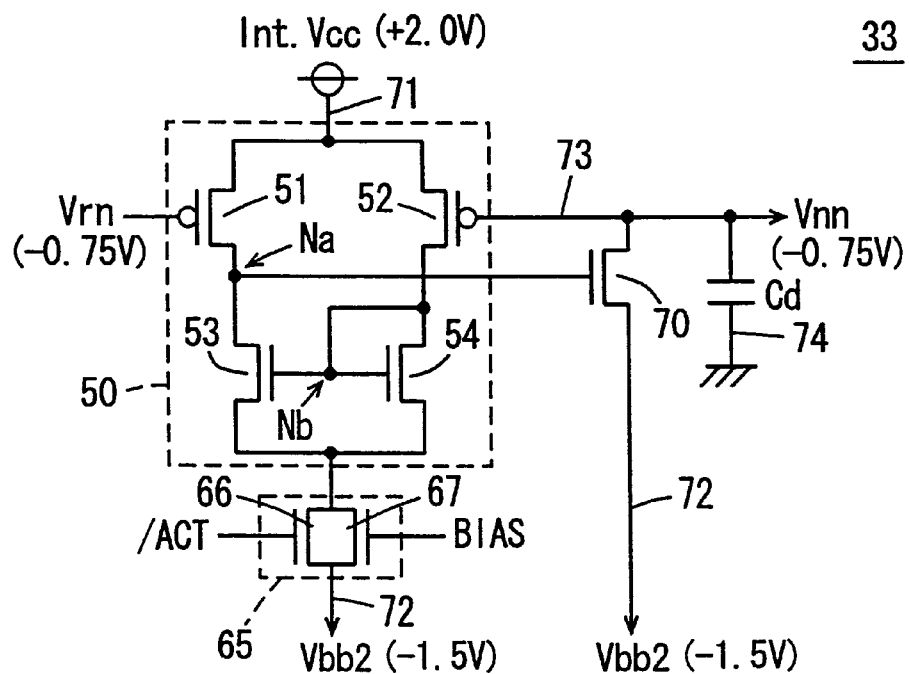
FIG. 7 is a circuit diagram showing a structure of a voltage converting circuit 33 of a voltage generating circuit according to a fourth embodiment of the present invention.

Referring to FIG. 7, voltage converting circuit 33 is different from voltage converting circuit 30 of the first embodiment in that a current adjusting circuit 65 is provided on the side of line 72 supplying Vbb2 rather than on the side of line 71 supplying power supply voltage Int.Vcc.

Other parts of the structure are similar to those of voltage converting circuit 30 of the first embodiment, and therefore description thereof will not be repeated.

N type transistors 53, 54, 66, 67 and 70 in voltage converting circuit 33 are back biased by negative voltage Vbb2.

In the structure of voltage converting circuit 30 according to the first embodiment of the present invention in which current adjusting circuit 60 is provided on the side of line 71, due to resistance components in P type transistors 61 and 62 per se which form current adjusting circuit 60 and a voltage difference between a source and a drain, responsiveness of P type transistors 51 and 52 forming differential amplifier 50 may be reduced.

Then, in a fourth embodiment, a current adjusting circuit 65 includes N type transistors 66 and 67 and inserted on the side of Vbb2. Thus, P type transistors 51 and 52 forming differential amplifier 50 are directly driven by a current flowing through line 71, so that control responsiveness with respect to a change in output voltage Vnn is further enhanced.

It is noted that a structure and arrangement of current adjusting circuit 65 shown in the fourth embodiment may of course include a combination of the second and third embodiments.

Fifth Embodiment

Figure 8:
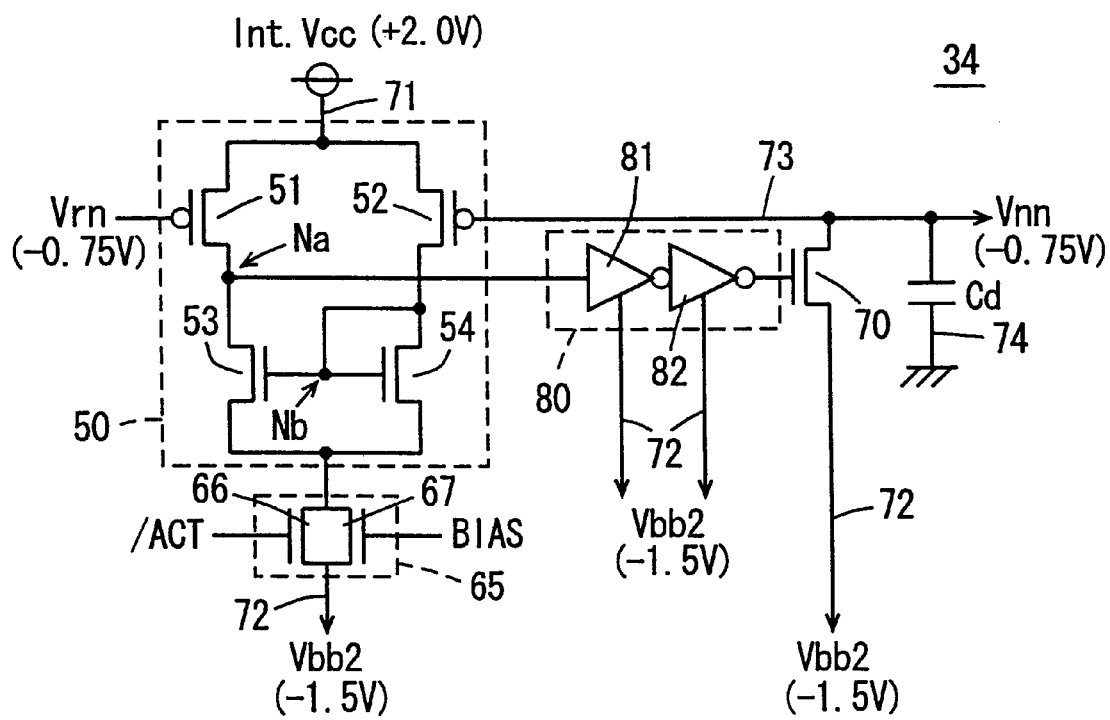
FIG. 8 is a circuit diagram showing a structure of a voltage converting circuit 34 of a voltage generating circuit according to a fifth embodiment of the present invention.

Referring to FIG. 8, a voltage converting circuit 34 is different from voltage converting circuit 33 of the fourth embodiment in that a signal converting circuit 80 is further provided between an output node Na of differential amplifier 50 and a gate of a current control transistor 70.

Other parts of the structure are similar to those of voltage converting circuit of the fourth embodiment, and therefore description thereof will not be repeated.

Signal converting circuit 80 includes two inverters 81 and 82 which are connected in series and driven by a negative voltage Vbb2. An N type transistor in voltage converting circuit 34 is back biased by negative voltage Vbb2.

Signal converting circuit 80 serves as a signal buffer by converting an output from differential amplifier 50 to a digital signal and applying it to a gate of current control transistor 70.

In such structure, as the output from differential amplifier 50 is converted to a digital signal amplified by the buffer, a gate voltage is decreased completely to negative voltage Vbb2 during the operation of current control transistor 70. Thus, current drivability of current control transistor 70 is increased.

In addition, as a size of current control transistor 70 necessary for ensuring the same level of current Livability is reduced, a layout area is effectively reduced.

It is noted that the structure shown in the fifth embodiment may include a combination of the first to third embodiments to provide a similar effect.

It is of course possible to apply the voltage generating circuit having the structure shown in the second to fifth embodiments to a semiconductor memory device as in the case of the application of the first embodiment.

In the first to fifth embodiments, the voltage converting circuit in the last stage is driven by the negative voltage which is generated in two stages by provision of two charge pump regulators. However, the application of the present invention is not limited to this. More specifically, another charge pump regulator is further provided and a relation between an input and output voltages in each charge pump regulator is determined in accordance with a strength of a breakdown voltage of a gate oxide film of a transistor, so that the voltage converting circuit of the last stage is driven by a negative voltage generated in steps.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage generating circuit generating a negative output voltage in accordance with a negative reference voltage, comprising:

a voltage converting circuit driven by a first voltage higher than said output voltage and a negative second voltage lower than said output voltage for generating said output voltage following said negative reference voltage; and a sub-voltage generating circuit supplying said second voltage and including first to m-th sub-voltage generators each driven by a corresponding first driving voltage equal to or lower than a ground voltage and equal to or higher than said second voltage and by a corresponding second driving voltage for generating a corresponding internal negative voltage, said first sub-voltage generator receiving the ground voltage as said corresponding first driving voltage and a positive third voltage as said corresponding second driving voltage for generating and controlling a first internal negative voltage so as to maintain a difference between said first internal negative voltage and said third voltage within a prescribed value, said i-th sub-voltage generator ($2 \leq i \leq m$) receiving an (i−1)th internal negative voltage generated by said (i−1)th sub-voltage generator as said corresponding first driving voltage and a positive (i+2)th voltage as said corresponding second driving voltage for generating and controlling an I-th internal negative voltage so as to maintain a difference between said i-th internal negative voltage and said (i+2)th voltage within said prescribed value, and said m-th sub-voltage generator generating said second voltage as said m-th internal negative voltage.

2. The voltage generating circuit according to claim 1, wherein said prescribed value is determined in accordance with a strength of a breakdown voltage of an oxide film of an MOS transistor forming each of said sub-voltage generators.

3. The voltage generating circuit according to claim 1, wherein said voltage converting circuit includes:

a first power supply line supplying said first voltage;

a second power supply line supplying said second voltage;

an output line transmitting said output voltage;

a differential amplification circuit supplied with current from said first and second power supply lines for outputting a voltage deviation signal in accordance with a difference between said output voltage and said negative reference voltage; and a current control circuit controlling a current flow between said second power supply line and said output line according to the level of said voltage deviation signal.

4. The voltage generating circuit according to claim 3, wherein said voltage converting circuit further includes
a ground line supplying a ground voltage, and
a voltage smoothing circuit connected between said ground line and said output line.

5. The voltage generating circuit according to claim 3, wherein said voltage converting circuit further includes a voltage smoothing circuit connected between said first power supply line and said output line.

6. The voltage generating circuit according to claim 3, wherein said voltage converting circuit further includes a current adjusting circuit connected between said first power supply line and said differential amplification circuit for adjusting an amount of current supplied for said differential amplification circuit in accordance with an operation state of a load supplied with said output voltage.

7. The voltage generating circuit according to claim 3, wherein said voltage converting circuit further includes current adjusting circuit connected between said second power supply line and said differential amplification circuit for adjusting an amount of current supplied for said differential amplification circuit in accordance with an operation state of a load supplied with said output voltage.

8. The voltage generating circuit according to claim 3, wherein
said voltage converting circuit further includes a signal converting circuit converting said voltage deviation signal to a digital signal, and
said current control circuit connects or disconnects said second power supply line and said output line in accordance with the digital signal.

9. The voltage generating circuit according to claim 8, wherein said signal converting circuit includes
a first inverter to which said voltage deviation signal is input, and
a second inverter inverting an output from said first inverter.

10. The voltage generating circuit according to claim 1, wherein said voltage converting circuit includes:
a ground line supplying a ground voltage;
a power supply line supplying said second voltage;
an output line transmitting said output voltage;
a differential amplification circuit supplied with current from said ground line and said power supply line for outputting a voltage deviation signal in accordance with a difference between said output voltage and said negative reference voltage; and
a current control circuit controlling a current flow between said power supply line and said output line according to the level of said voltage deviation signal.

11. The voltage generating circuit according to claim 10, wherein said voltage converting circuit further includes a voltage smoothing circuit connected between said ground line and said output line.

12. The voltage generating circuit according to claim 10, wherein said voltage converting circuit further includes a signal converting circuit converting said voltage deviation signal to a digital signal, and
said current control circuit connects and disconnects said power supply line and said output line in accordance with the digital signal.

13. The voltage generating circuit according to claim 12, wherein said signal converting circuit includes
a first inverter having said voltage deviation signal as an input, and
a second inverter inverting an output from said first inverter.

14. A semiconductor device comprising:
a voltage converter driven by a first voltage higher than a negative output voltage and a negative second voltage lower than the output voltage for generating the output voltage; and
a negative voltage supply circuit for supplying the second voltage, said negative voltage supply circuit including (i) a first negative voltage generator driven by a positive first driving voltage and a second driving voltage lower than the first driving voltage for generating a first internal negative voltage, and (ii) a second negative voltage generator driven by a positive third driving voltage lower than the first driving voltage and the first internal negative voltage as a fourth driving voltage for generating a second internal negative voltage lower than the first internal negative voltage as the second voltage.

15. The semiconductor device according to claim 14, wherein said voltage converter includes
a differential amplifier driven by the first and second voltages for outputting a voltage deviation signal in accordance with a difference between the output voltage and a target voltage level of the output voltage; and
a transistor coupled between an output of said voltage converter and a negative voltage node supplied with the second voltage, and responsive to the voltage deviation signal for connecting the output of said voltage converter with the negative voltage node.

16. The semiconductor device according to claim 15, wherein said voltage converter has a capacitance provided between the output of said voltage converter and a node supplied with the first voltage.

17. The semiconductor device according to claim 15, wherein said voltage converter further includes a current adjusting circuit coupled between said differential amplifier and a node supplied with the second voltage for adjusting an amount of current supplied for said differential amplifier in accordance with an operation state of a load supplied with the output voltage.

18. The semiconductor device according to claim 15, wherein said voltage converter includes a signal converter for converting the voltage deviation signal to a digital signal received by a gate of said transistor.

19. The semiconductor device according to claim 18, wherein said signal converter includes an inverter driven by the second voltage.

20. The semiconductor device according to claim 14, wherein the first voltage is a ground voltage.

21. The semiconductor device according to claim 14, further comprising a word line connected to a memory cell and supplied with the second voltage.

* * * * *